(12) United States Patent
Ahmad et al.

(10) Patent No.: US 6,660,600 B2
(45) Date of Patent: Dec. 9, 2003

(54) METHODS OF FORMING INTEGRATED CIRCUITRY, METHODS OF FORMING ELEVATED SOURCE/DRAIN REGIONS OF A FIELD EFFECT TRANSISTOR, AND METHODS OF FORMING FIELD EFFECT TRANSISTORS

(75) Inventors: Aftab Ahmad, Colorado Springs, CO (US); Lyle Jones, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/233,020

(22) Filed: Aug. 30, 2002

(65) Prior Publication Data

US 2002/0197804 A1 Dec. 26, 2002

Related U.S. Application Data

(63) Continuation of application No. 09/771,449, filed on Jan. 26, 2001, now Pat. No. 6,444,529.

(51) Int. Cl.$^7$ ............................................. H01L 21/336
(52) U.S. Cl. ...................................................... 438/300
(58) Field of Search ................................. 438/300, 275, 438/303, 305

(56) References Cited

U.S. PATENT DOCUMENTS

| | | | |
|---|---|---|---|
| 4,587,710 A | 5/1986 | Tsao | 29/571 |
| 4,784,971 A | 11/1988 | Chiu et al. | 437/57 |
| 4,948,745 A | 8/1990 | Pfiester et al. | 437/41 |
| 5,314,832 A | 5/1994 | Deleonibus | 437/27 |
| 5,352,631 A | 10/1994 | Sitaram et al. | 437/200 |
| 5,395,787 A | 3/1995 | Lee et al. | 437/57 |
| 5,496,475 A | 3/1996 | Jho et al. | 437/41 |
| 5,504,031 A | 4/1996 | Hsu et al. | 437/57 |
| 5,571,733 A | 11/1996 | Wu et al. | 437/34 |
| 5,637,518 A | 6/1997 | Prall et al. | 438/301 |
| 5,674,774 A | 10/1997 | Pasch et al. | 437/41 |
| 5,731,239 A | 3/1998 | Wong et al. | 438/296 |
| 5,773,358 A | 6/1998 | Wu et al. | 438/564 |
| 5,780,349 A | 7/1998 | Naem | 438/305 |

(List continued on next page.)

OTHER PUBLICATIONS

Wolf, "Silicon processing for the VLSI era" vol. 1, ppg , 320–323 and 520–523.

(List continued on next page.)

Primary Examiner—David Nelms
Assistant Examiner—Quoc Hoang
(74) Attorney, Agent, or Firm—Wells St. John P.S.

(57) ABSTRACT

Methods of forming integrated circuitry, methods of forming elevated source/drain regions, and methods of forming field effect transistors are described. In one embodiment, a transistor gate line is formed over a semiconductive substrate. A layer comprising undoped semiconductive material is formed laterally proximate the transistor gate line and joins with semiconductive material of the substrate and comprises elevated source/drain material for a transistor of the line. Subsequently, conductivity-modifying impurity is provided into the elevated source/drain material. In another embodiment, a common step is utilized to provide conductivity enhancing impurity into both elevated source/drain material and material of the gate line. In another embodiment, the undoped semiconductive layer is first patterned and etched to provide elevated source/drain regions prior to provision of the conductivity-modifying impurity. In another embodiment, the semiconductive material is first patterned with conductivity modifying impurity being provided into selected portions of the semiconductive material. Undoped semiconductive portions are subsequently removed selectively relative to doped semiconductive material portions.

72 Claims, 9 Drawing Sheets

U.S. PATENT DOCUMENTS

| | | |
|---|---|---|
| 5,811,329 A | 9/1998 | Ahmad et al. .............. 438/233 |
| 5,827,768 A | 10/1998 | Lin et al. .................... 438/300 |
| 5,851,833 A | 12/1998 | Atala ......................... 435/378 |
| 5,885,877 A | 3/1999 | Gardner et al. ............. 438/300 |
| 5,897,357 A | 4/1999 | Wu et al. .................... 438/300 |
| 5,902,125 A | 5/1999 | Wu ............................ 438/300 |
| 5,915,183 A | 6/1999 | Gambino et al. ........... 438/300 |
| 5,953,605 A | 9/1999 | Kodama ..................... 438/231 |
| 5,998,844 A | 12/1999 | Prall et al. .................. 257/377 |
| 6,001,698 A | 12/1999 | Kodura ...................... 438/303 |
| 6,083,798 A | 7/2000 | Lin ............................ 438/297 |
| 6,211,026 B1 * | 4/2001 | Ahmad et al. .............. 438/300 |
| 6,239,472 B1 | 5/2001 | Shenoy ...................... 257/408 |
| 6,313,505 B2 | 11/2001 | Yu ............................. 257/336 |
| 6,342,422 B1 * | 1/2002 | Wu ............................ 438/300 |

OTHER PUBLICATIONS

Nakahara et al. Ultra–shallow in–situ–doped raised source/drain structure for sub–tenth micron CMOS, IEEE 1996 Symp, on VLSI Tech Dig. of Tech. Papers, pp. 174.

Rodder, et al Raised source/drain MOSFET with Dual Sidewall Spacers, IEEE Elect. Dev. Lett. vol. 12, No. 3, ppg 89.

* cited by examiner

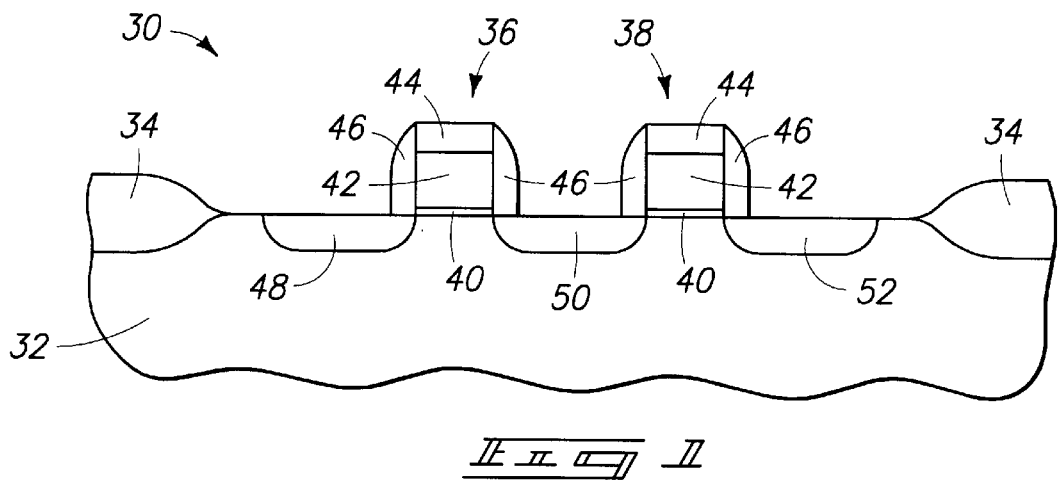
_FIG. 1_
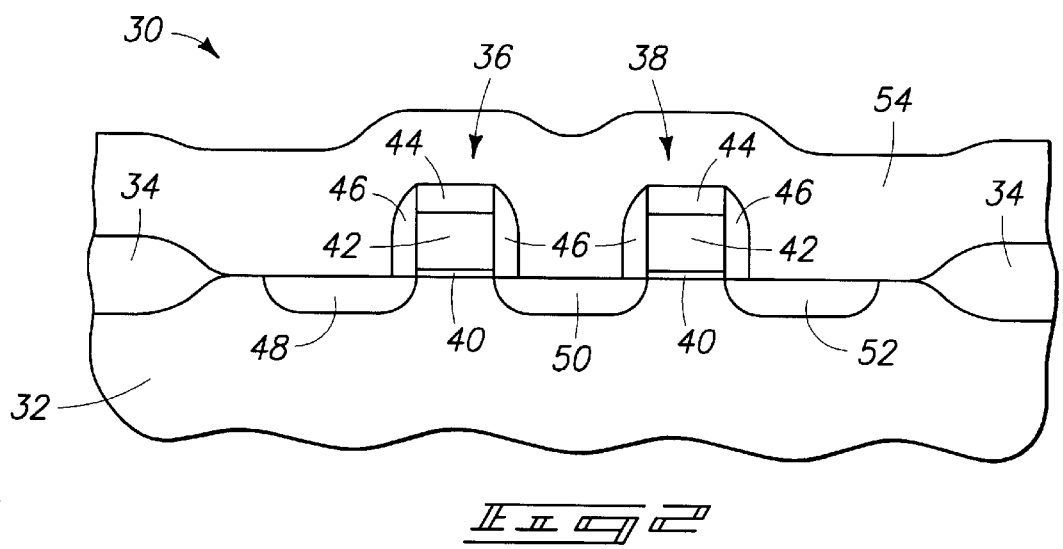
_FIG. 2_
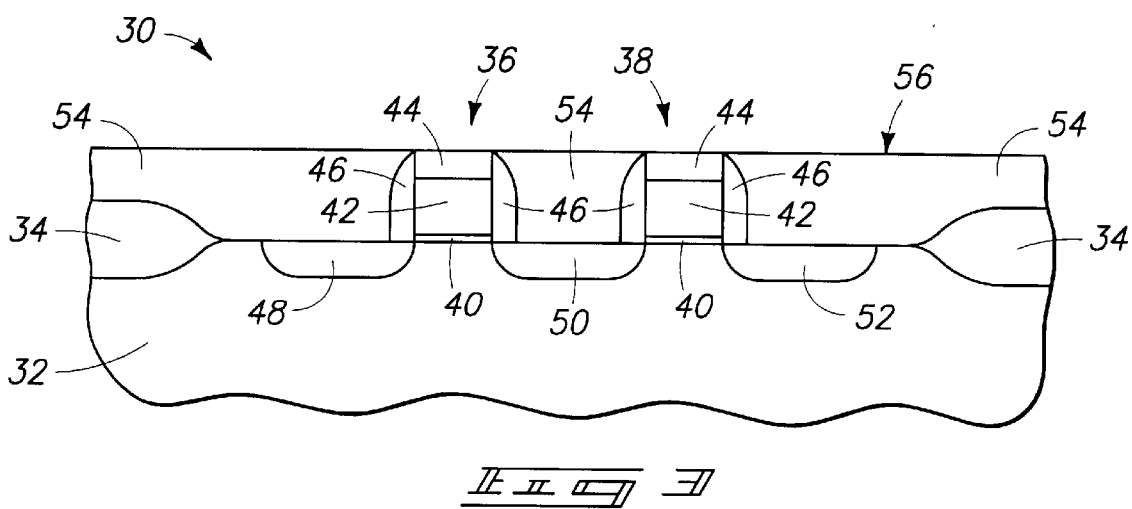
_FIG. 3_

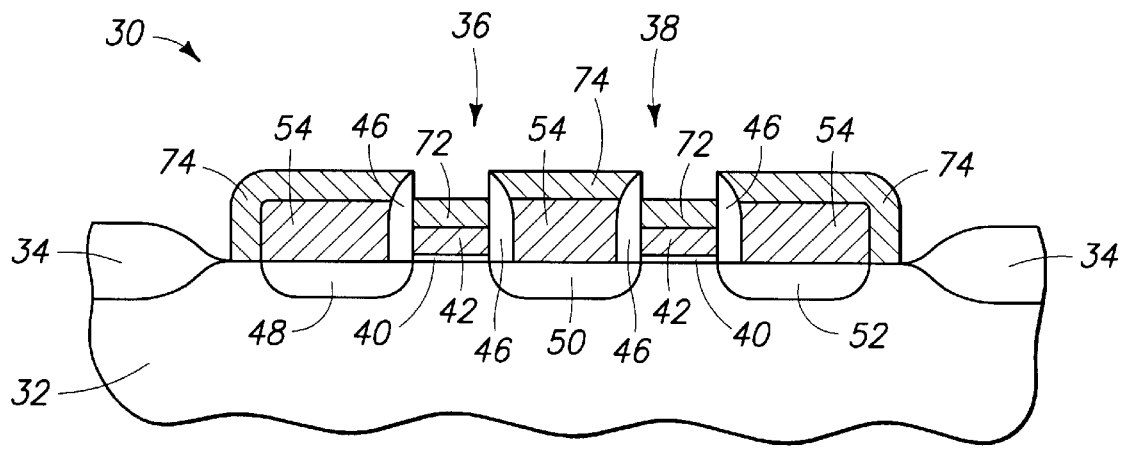
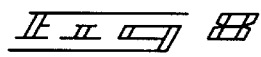
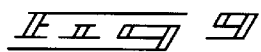

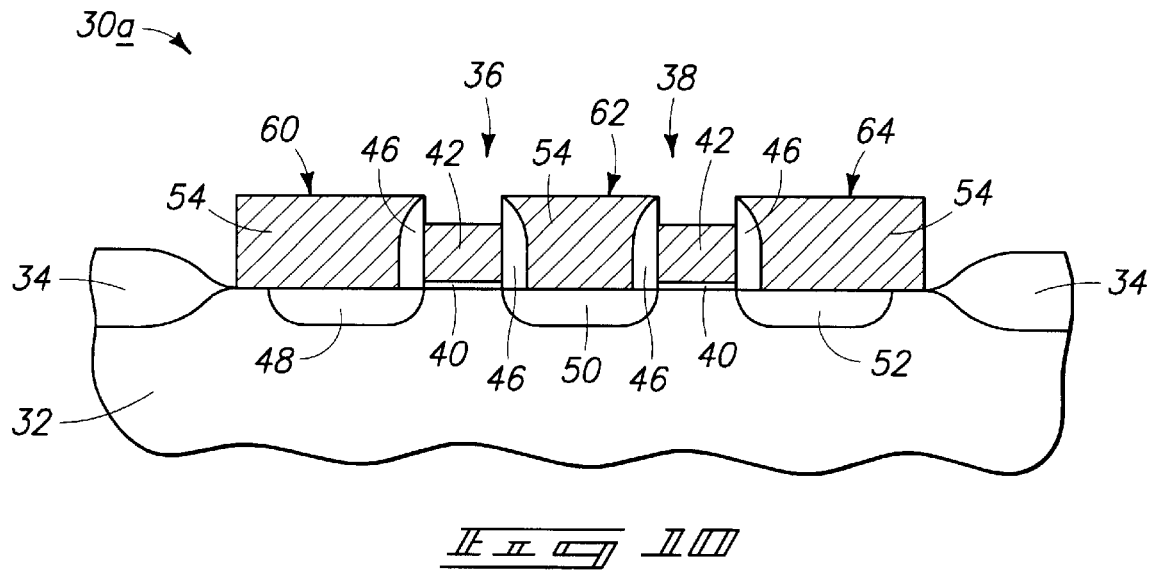
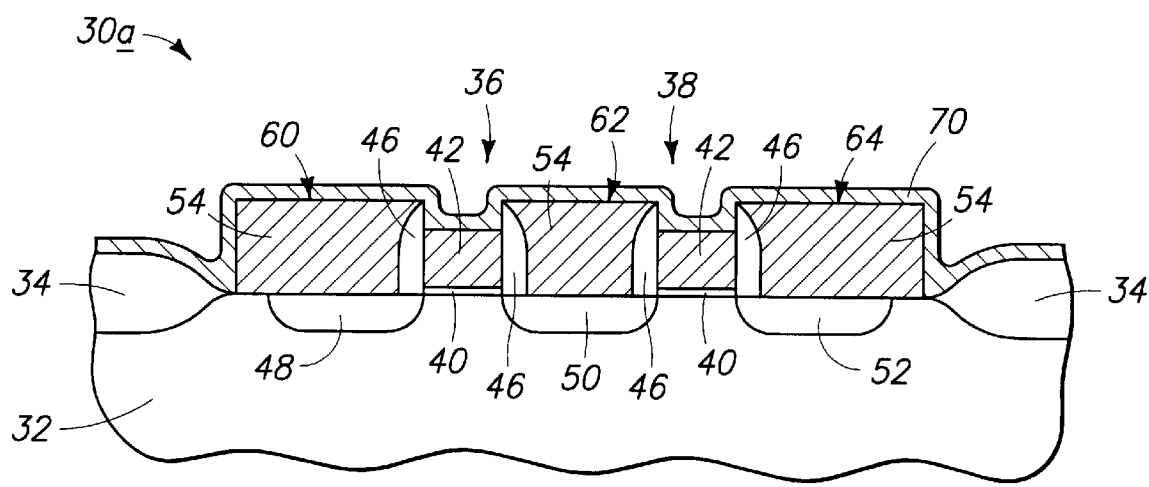

METHODS OF FORMING INTEGRATED CIRCUITRY, METHODS OF FORMING ELEVATED SOURCE/DRAIN REGIONS OF A FIELD EFFECT TRANSISTOR, AND METHODS OF FORMING FIELD EFFECT TRANSISTORS

RELATED PATENT DATA

This patent resulted from a continuation application of U.S. patent application Ser. No. 09/771,449, filed on Jan. 26, 2001, now U.S. Pat. No. 6,444,529 which resulted from a continuation application of U.S. Pat. No. 6,211,026, issued Apr. 3, 2001.

TECHNICAL FIELD

This invention relates to methods of forming integrated circuitry, to methods of forming elevated source/drain regions of a field effect transistor, and to methods of forming field effect transistors.

BACKGROUND OF THE INVENTION

As integrated circuitry device dimensions continue to shrink, problems such as short channel effects, source-drain punchthrough, and hot electron susceptibility become ever present, particularly in the deep sub-half-micron regime. These effects have, in the past, been addressed by additional masking levels and through the incorporation of lightly doped drain (LDD) engineering.

This invention arose out of concerns associated with providing improved integrated circuitry devices while reducing problems associated with short channel effects, source-drain punchthrough, and hot electron susceptibility, particularly in the deep sub-half-micron regime.

SUMMARY OF THE INVENTION

Methods of forming integrated circuitry, methods of forming elevated source/drain regions, and methods of forming field effect transistors are described. In one embodiment, a transistor gate line is formed over a semiconductive substrate. A layer comprising undoped semiconductive material is formed laterally proximate the transistor gate line and joins with semiconductive material of the substrate and comprises elevated source/drain material for a transistor of the line. Subsequently, conductivity-modifying impurity is provided into the elevated source/drain material. In another embodiment, a common step is utilized to provide conductivity enhancing impurity into both elevated source/drain material and material of the gate line. In another embodiment, the undoped semiconductive layer is first patterned and etched to provide elevated source/drain regions prior to provision of the conductivity-modifying impurity. In another embodiment, the semiconductive material is first patterned, with conductivity-modifying impurity being subsequently provided into selected portions of the semiconductive material. Undoped semiconductive portions are subsequently removed selectively relative to doped semiconductive material portions.

BRIEF DESCRIPTION OF THE DRAWINGS

Preferred embodiments of the invention are described below with reference to the following accompanying drawings.

FIG. 1 is a diagrammatic side sectional view of a semiconductor wafer fragment in process in accordance with one embodiment of the present invention.

FIG. 2 is a view of the FIG. 1 wafer fragment at a processing step which is subsequent to that which is shown in FIG. 1.

FIG. 3 is a view of the FIG. 1 wafer fragment at a processing step which is subsequent to that which is shown in FIG. 2.

FIG. 8 is a view of the FIG. 1 wafer fragment at a processing step which is subsequent to that which is shown in FIG. 7.

FIG. 9 is a diagrammatic side sectional view of a semiconductor wafer fragment in process in accordance with another embodiment of the present invention.

FIG. 10 is a view of the FIG. 9 wafer fragment at a processing step which is subsequent to that which is shown in FIG. 9.

FIG. 11 is a view of the FIG. 9 wafer fragment at a processing step which is subsequent to that which is shown in FIG. 10.

DETAILED DESCRIPTION OF THE PREFERRED EMBODIMENTS

Figure 4:
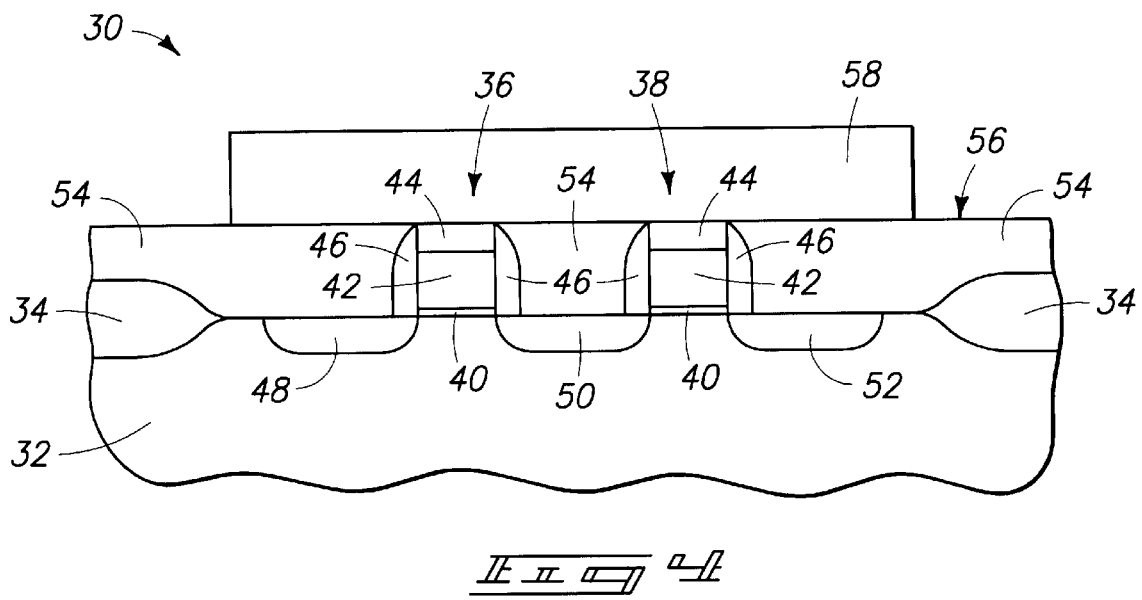
FIG. 4 is a view of the FIG. 1 wafer fragment at a processing step which is subsequent to that which is shown in FIG. 3.

This disclosure of the invention is submitted in furtherance of the constitutional purposes of the U.S. Patent Laws "to promote the progress of science and useful arts" (Article 1, Section 8).

Referring to FIG. 1, a semiconductor wafer fragment in process is shown generally at 30 and includes a semiconductive substrate 32. In the context of this document, the term "semiconductive substrate" is defined to mean any construction comprising semiconductive material, including, but not limited to, bulk semiconductive materials such as a semiconductive wafer (either alone or in assemblies comprising other materials thereon semiconductive material layers (either alone or in assemblies comprising other materials). The term "substrate" refers to any supporting structure, including, but not limited to, the semiconductive substrates described above.

Isolation regions 34 are formed within substrate 32 and comprise an oxide material. A plurality of lines, e.g. transistor gate lines are formed over the substrate with exemplary gate lines being shown at 36, 38 respectively. Gate lines 36, 38 include a gate oxide layer 40, a layer of semiconductive material 42, and insulative material caps 44. In this example, layer 42 comprises undoped semiconductive gate line material, with undoped polysilicon being an exemplary material. In the context of this document, "undoped" will be understood to include those materials which, as deposited or formed, do not include meaningful amounts of p-type or n-type materials. An exemplary material for insulative caps 44 is silicon dioxide. For purposes of the ongoing discussion, layer 42 constitutes a layer of first-formed semiconductive material.

Gate lines 36, 38 constitute a pair of spaced-apart gate lines which, in a preferred embodiment, comprise a portion of dynamic random access memory (DRAM) circuitry. Sidewall spacers 46 are formed over transistor gate lines 36, 38 and can comprise nitride and/or oxide materials. Source/drain diffusion regions 48, 50, and 52 are formed within and received by substrate 32.

Referring to FIG. 2, a material layer 54 is formed over substrate 32, and preferably comprises an undoped semiconductive material. Layer 54 constitutes a second-formed layer of semiconductive material which is formed laterally proximate gate lines 36, 38 and joins with semiconductive material of substrate 32 laterally proximate each gate line, e.g. diffusion regions 48, 50, and 52. As formed, layer 54 constitutes elevated source/drain material for gate lines 36, 38. An exemplary material for layer 54 is undoped polysilicon which can be formed to an elevational thickness of around 4,000 Angstrom.

Referring to FIG. 3, material of layer 54 is removed to isolate remaining material relative to the conductive lines. In this example, layer 54 is planarized, as by chemical-mechanical polishing, to provide a generally planar outer surface 56. Planarization can be made to stop on or proximate insulative caps 44. Alternately, layer 54 can be etched back, with such etching stopping on or proximate the insulative caps. Although not specifically shown, further portions of layer 54 can be removed to recess the material relative to gate lines 36, 38.

At this point in processing, insulative caps 44 can be etched away or otherwise removed from over semiconductive material 42 to expose an outer surface thereof for purposes which will become evident below. Such a construction is shown in FIG. 6.

Referring to FIG. 4, a patterned masking layer 58 is formed over substrate 32 and over portions of the undoped semiconductive material of layer 54. Exemplary material for layer 58 is photoresist.

Figure 5:
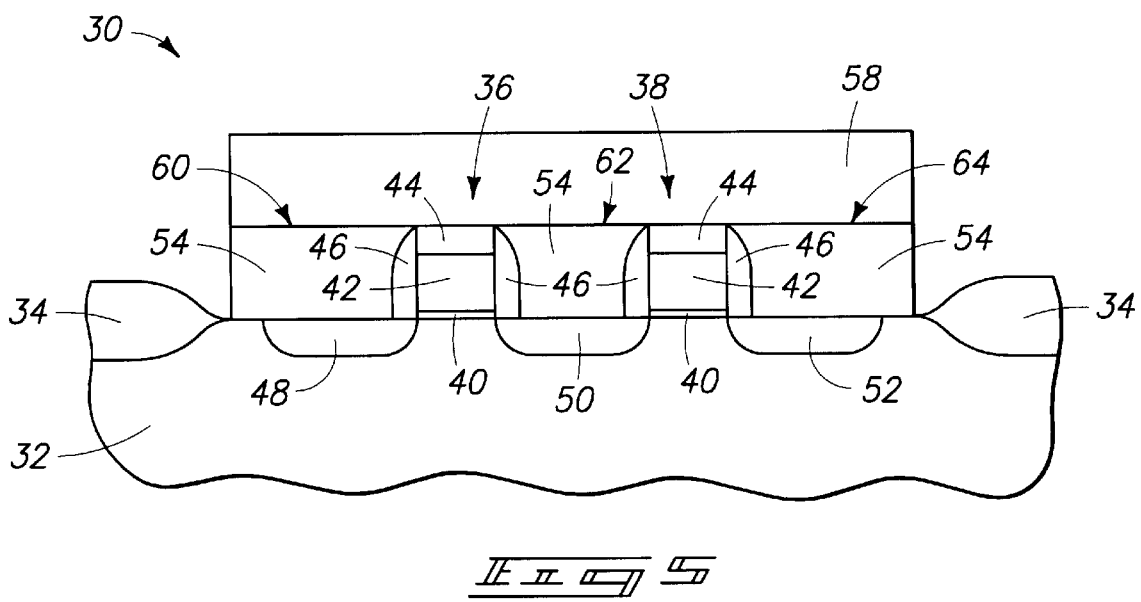
FIG. 5 is a view of the FIG. 1 wafer fragment at a processing step which is subsequent to that which is shown in FIG. 4.

Referring to FIG. 5, unmasked elevated source/drain material portions are removed to provide individual elevated source/drain regions 60, 62, and 64. In this example, such material is removed prior to provision of conductivity-modifying or conductivity-enhancing impurity thereinto. In one embodiment, the unmasked portions are etched, preferably through an anisotropic dry etch, which is sufficient to provide the elevated source/drain regions.

Figure 6:
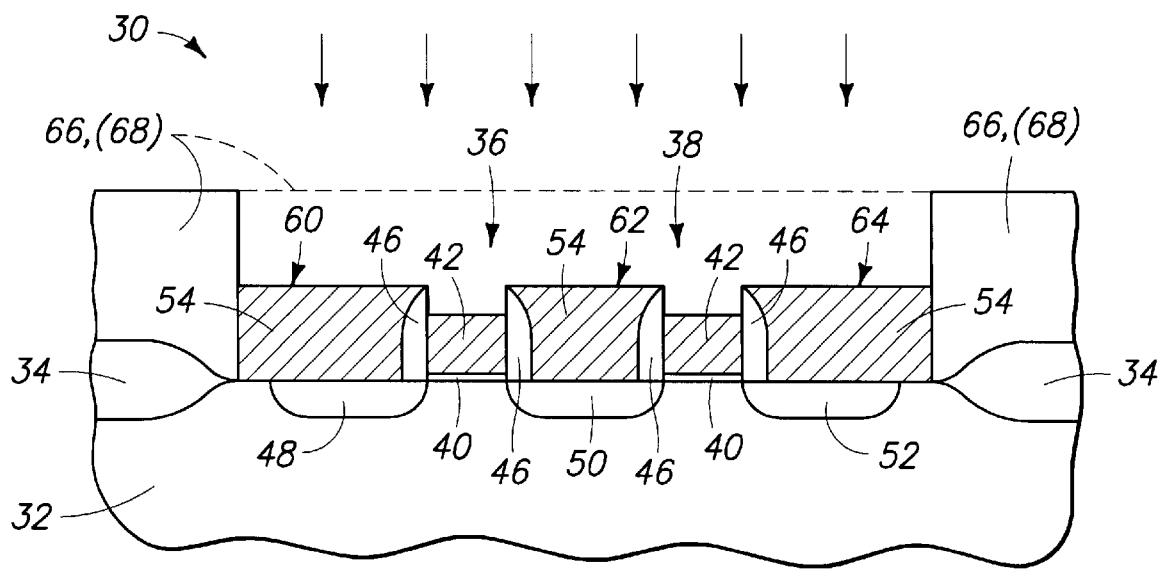
FIG. 6 is a view of the FIG. 1 wafer fragment at a processing step which is subsequent to that which is shown in FIG. 5.

Referring to FIG. 6, a patterned masking layer 66 is formed over substrate 32. In one embodiment, conductivity-modifying or conductivity-enhancing impurity is provided into the elevated source/drain material of regions 60, 62, and 64. In one embodiment, the insulative caps 44 are preferably removed and provision of the impurity comprises also providing the impurity into the exposed, undoped semiconductive gate line material 42. Accordingly, such can constitute in a common step, providing impurity into both the lines and source/drain regions proximate thereto to form highest conductive portions of the source/drain regions and render the undoped semiconductive material of the line conductive. Alternately considered, this embodiment can constitute contemporaneously providing impurity into exposed undoped semiconductive gate line material 42, as well as material comprising regions 60, 62, and 64. Provision of impurity can take place to a concentration of $10^{20}$ cm$^{-3}$.

In one embodiment, material of both the elevated source/drain regions 60–64, and semiconductive gate material 42 is commonly doped in different steps. Such different steps can provide different impurity doses at different energy levels. In one embodiment, the semiconductive material is doped with a first dose of impurity which is provided at a first energy level, and then a second dose of impurity which is provided at a second energy level. The first dose is preferably substantially the same as the second dose, with an exemplary dose being 5×10$^{12}$ atoms/cm$^2$. Preferably, the second energy level is less than the first energy level, with an exemplary first energy level being 85 keV and an exemplary second energy level being 35 keV. Such will result in concentrations of implanted impurities which vary within the semiconductive material.

In another embodiment, a first region of elevated source/drain material is masked (with patterned masking layer 66 and not specifically shown) while a second region of elevated source/drain material (e.g. regions 60, 62, and 64) is doped with an impurity of a second type. In this example, masking layer 66 can be used to open up n-channel active areas, as well as gate regions to allow implantation of the undoped polysilicon over not only the active areas, but the polysilicon gate regions as well. Exemplary material for such doping include arsenic and/or phosphorous. In accordance with this embodiment, masking layer 66 is subsequently removed, and a second region of elevated source/drain material is masked, e.g. with masking layer 68, while a first region of elevated source/drain material (not specifically shown but disposed within masking layer openings which are substantially similar to the opening defined by previous masking layer 66) is provided with an impurity of a first type. In this example, masking layer 68 can be used to open up p-channel active areas, as well as gate regions to allow implantation of the undoped polysilicon over not only the active areas, but the polysilicon gate regions as well. Exemplary materials include boron and BF$_2$.

Figure 7:
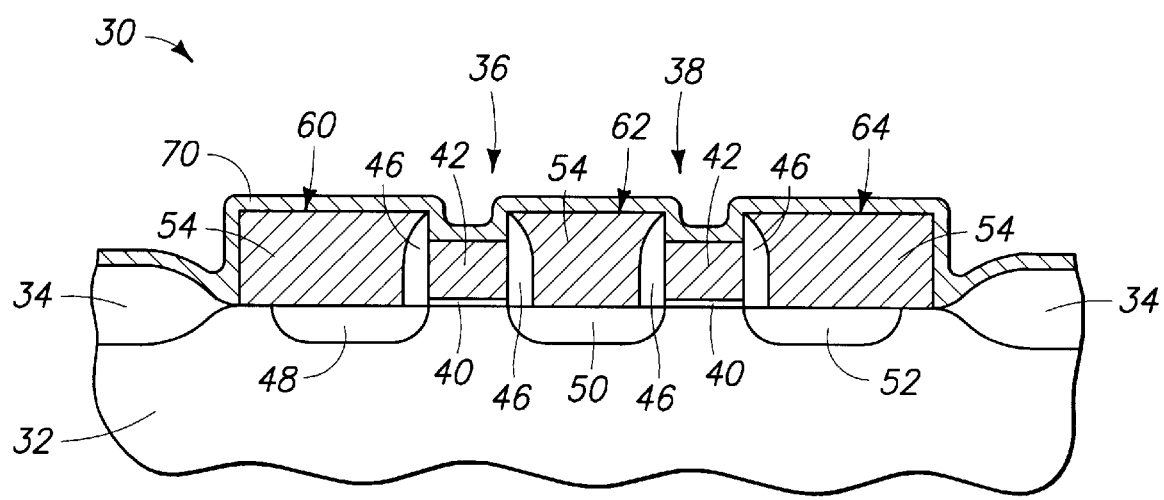
FIG. 7 is a view of the FIG. 1 wafer fragment at a processing step which is subsequent to that which is shown in FIG. 6.

Referring to FIGS. 7 and 8, a refractory metal layer 70 (FIG. 7) is formed over substrate 32. Exemplary materials include titanium and cobalt. In one embodiment, refractory metal layer 70 is formed over silicon-containing material of transistor gate lines 36, 38 and exposed to annealing conditions which are effective to render it into a conductive gate line silicide 72 (FIG. 8). In another embodiment, refractory metal layer 70 constitutes a common refractory metal layer which is formed over both exposed silicon-containing material of transistor gate lines 36, 38, and the elevated source/drain material comprising regions 60, 62, and 64. Subsequently, layer 70 is exposed to annealing conditions which are sufficient to render it into both the gate line silicide 72 and a source/drain material silicide 74 (FIG. 8).

Referring to FIG. 8, and alternately considered, a gate line silicide layer 72 is formed over exposed material of gate lines 36, 38 respectively. Elevated source/drain region silicide layers 74 are formed over elevated source/drain material comprising portions of the source/drain regions. In a preferred embodiment, the silicide layers are contemporaneously provided over the illustrated materials.

Referring to FIG. 9, a semiconductor wafer fragment in accordance with an alternate embodiment of the present invention is shown generally at 30a and includes a semiconductive substrate 32. Like numerals from the above-described embodiment have been utilized where appropriate, with differences being indicated by the suffix "a" or with different numerals.

A material layer 54 is formed over substrate 32 and processed as described above, which can include the planarization thereof. A patterned masking layer 76 is formed over the substrate including portions of undoped semiconductive material 54. Masking layer 76 defines a masking layer opening 78 which is disposed over only a portion of undoped semiconductive material of layer 54. Accordingly, material elevationally below masking layer 76 constitutes covered portions of layer 54, while exposed portions of layer 54 comprise elevated source/drain material regions for the field effect transistors. A semiconductive outer surface of gates lines 36, 38 is exposed through masking layer opening 78 (as the insulative caps thereover were previously removed).

Conductivity-modifying or conductivity-enhancing impurity is provided, preferably contemporaneously, into exposed semiconductive material 42 and exposed or unmasked portions of layer 54. Such impurity can be provided in the concentration mentioned above. Such materials can be doped as described above utilizing the first and second doses provided at the first and second energy levels, respectively. Accordingly, material of layer 54 disposed elevationally below masking layer 76 remains substantially undoped laterally outward of doped elevated source/drain regions 60, 62, and 64. After the provision of the impurity, the masking layer can be stripped.

Referring to FIG. 10, the undoped source/drain material portions are removed to provide elevated source/drain regions 60, 62, and 64. In a preferred embodiment, the removal of such material takes place through an etch which is effective to remove elevated source/drain material containing less impurity than elevated source/drain material containing more impurity. In the illustrated example, a wet etch is conducted which selectively removes undoped semiconductive material relative to the doped semiconductive material. By selectively is meant removing of one layer relative to another layer in a ratio of 5:1 or greater. An exemplary wet etch comprises two percent by volume tetramethyl ammonium hydroxide (TMAH) in water. Etch chemistries could, of course, be changed to achieve higher etch selectivity to doped versus undoped polysilicon. Accordingly, removal of the elevated source/drain material portions in this embodiment takes place after provision of the doping impurity and constitutes removing previously-masked portions of the semiconductive material layer to provide the elevated source/drain regions which comprise the previously-unmasked portions.

Subsequently, the substrate can be annealed such that both n+ and p+ plugs or source/drain regions, and n+ gate/p+ gate material is annealed at the same time.

Figure 12:
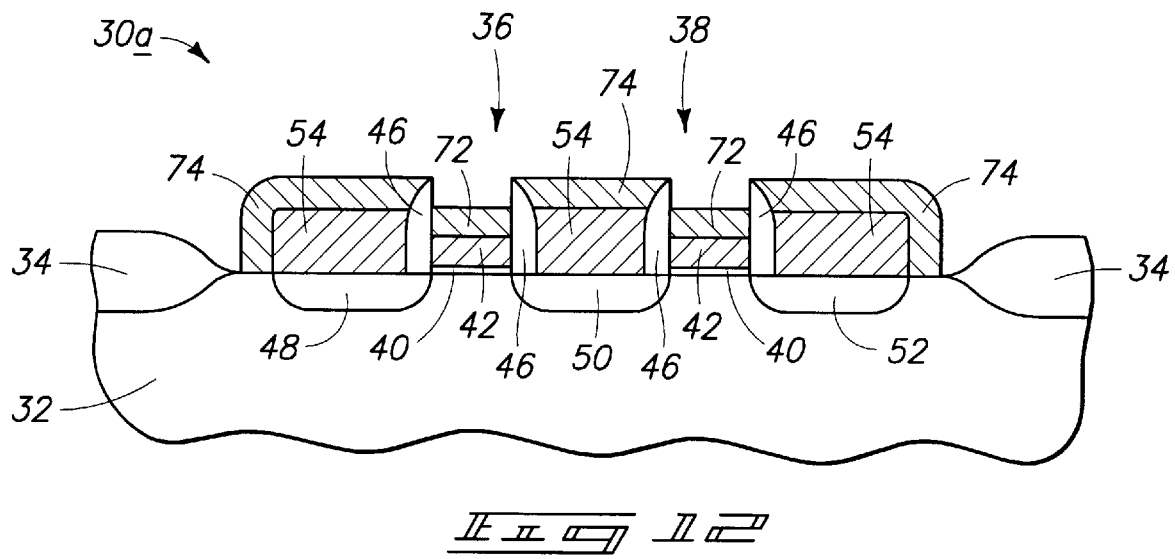
FIG. 12 is a view of the FIG. 9 wafer fragment at a processing step which is subsequent to that which is shown in FIG. 11.

Referring to FIGS. 11 and 12, a refractory metal layer 70 is formed over substrate 32. Exemplary materials include titanium and cobalt. In one embodiment, refractory metal layer 70 is formed over silicon-containing material of transistor gate lines 36, 38 and exposed to annealing conditions which are effective to render it into a conductive gate line silicide 72 (FIG. 12). In another embodiment, refractory metal layer 70 constitutes a common refractory metal layer which is formed over both exposed silicon-containing material of transistor gate lines 36, 38, and the elevated source/drain material comprising regions 60, 62, and 64. Subsequently, layer 70 is exposed to annealing conditions which are sufficient to render it into both the gate line silicide 72 and a source/drain material silicide 74 (FIG. 12).

Referring to FIG. 12, and alternately considered, a gate line silicide layer 72 is formed over exposed material of gate lines 36, 38 respectively. Elevated source/drain region silicide layers 74 are formed over elevated source/drain material comprising portions of the source/drain regions. In a preferred embodiment, the silicide layers are contemporaneously provided over the illustrated materials. In this example, silicide layers 72, 74 are provided after provision of the impurity and the subsequent wet etching of the undoped semiconductive material.

Figure 13:
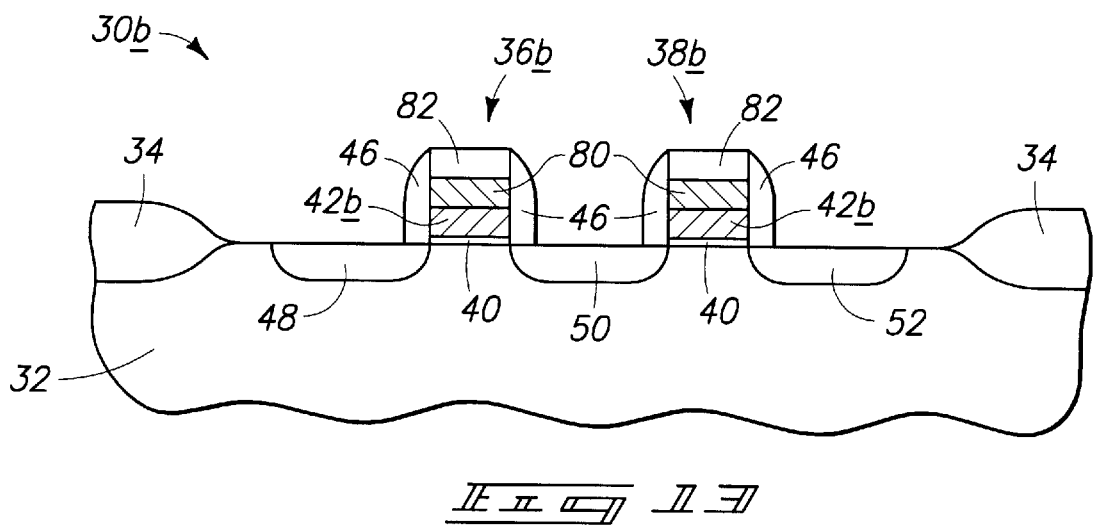
FIG. 13 is a diagrammatic side sectional view of a semiconductor wafer fragment in process in accordance with another embodiment of the present invention.

Referring to FIG. 13, a semiconductor wafer fragment in process in accordance with another embodiment of the invention is shown generally at 30b and includes a semiconductive substrate 32. Like numerals from the above described embodiment have been utilized where appropriate with differences being indicated by the suffix "b" or with different numerals.

In this example, a pair of spaced-apart conductive lines 36b, 38b are formed over substrate 32 and include a gate oxide layer 40, a doped semiconductive material layer 42b, e.g. polysilicon, a silicide layer 80, e.g. tungsten silicide, and an insulative cap 82 comprising a material such as nitride. Layer 42b is preferably in-situ doped polysilicon.

Figure 14:
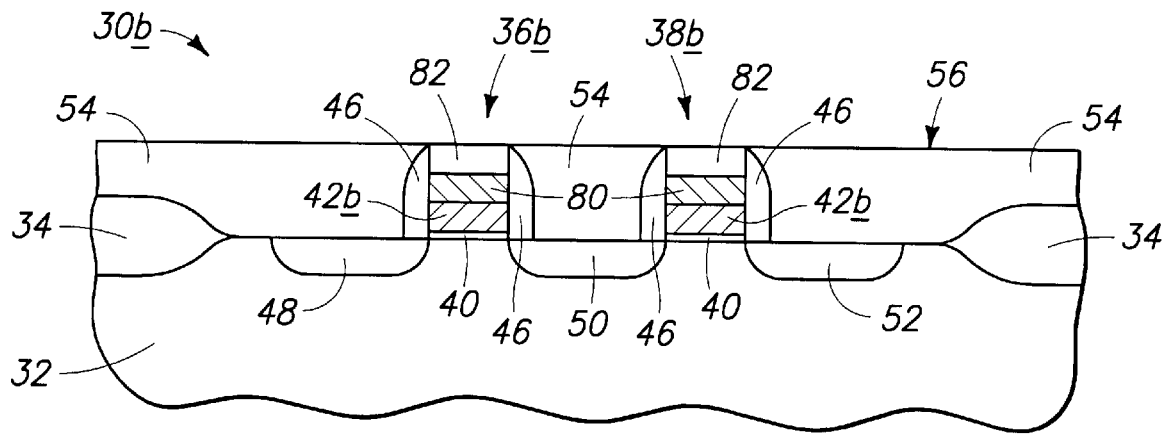
FIG. 14 is a view of the FIG. 13 wafer fragment at a processing step which is different from that which is shown in FIG. 13.

Referring to FIG. 14, a material layer 54 is formed over substrate 32, and preferably comprises an undoped semiconductive material. Layer 54 constitutes a second-formed layer of semiconductive material which is formed laterally proximate gate lines 36, 38 and joins with semiconductive material of substrate 32 laterally proximate each gate line, e.g. diffusion regions 48, 50, and 52. As formed, layer 54 constitutes elevated source/drain material for gate lines 36b, 38b. An exemplary material for layer 54 is undoped polysilicon which can be formed to an elevational thickness of around 4,000 Angstrom.

Material of layer 54 can be removed, as described above, to isolate remaining material relative to the conductive lines. In this example, layer 54 is planarized, as by chemical-mechanical polishing, to provide a generally planar outer surface 56. Planarization can be made to stop on or proximate insulative caps 82. Alternately, layer 54 can be etched back, with such etching stopping on or proximate the insulative caps. Although not specifically shown, further portions of layer 54 can be removed to recess the material relative to gate lines 36b, 38b.

Figure 15:
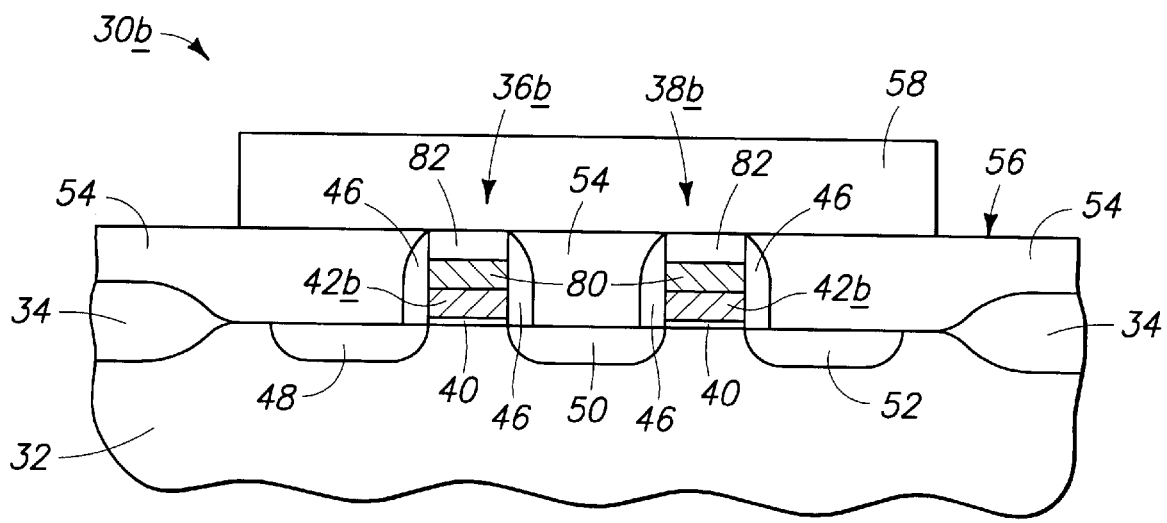
FIG. 15 is a view of the FIG. 13 wafer fragment at a processing step which is subsequent to that which is shown in FIG. 14.

Referring to FIG. 15, a patterned masking layer 58 is formed over substrate 32 and over portions of the undoped semiconductive material of layer 54. Exemplary material for layer 58 is photoresist.

Figure 16:
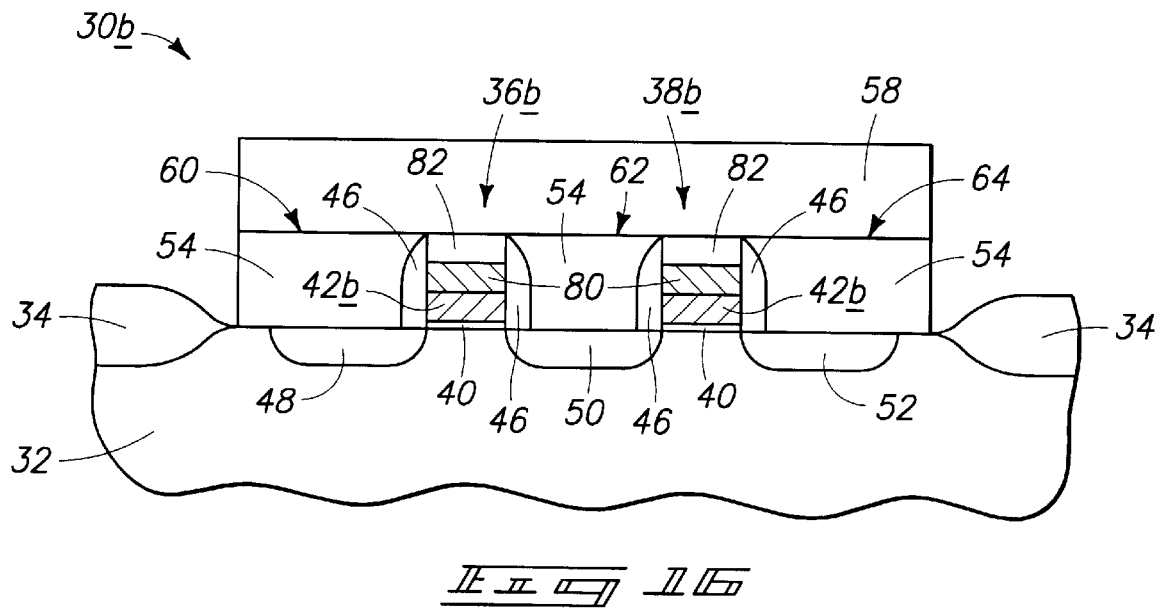
FIG. 16 is a view of the FIG. 13 wafer fragment at a processing step which is subsequent to that which is shown in FIG. 15.

Referring to FIG. 16, unmasked elevated source/drain material portions are removed to provide individual elevated source/drain regions 60, 62, and 64. In this example, such material is removed prior to provision of conductivity-modifying or conductivity-enhancing impurity thereinto. In one embodiment, the unmasked portions are etched, preferably through an anisotropic dry etch, which is sufficient to provide the elevated source/drain regions.

Figure 17:
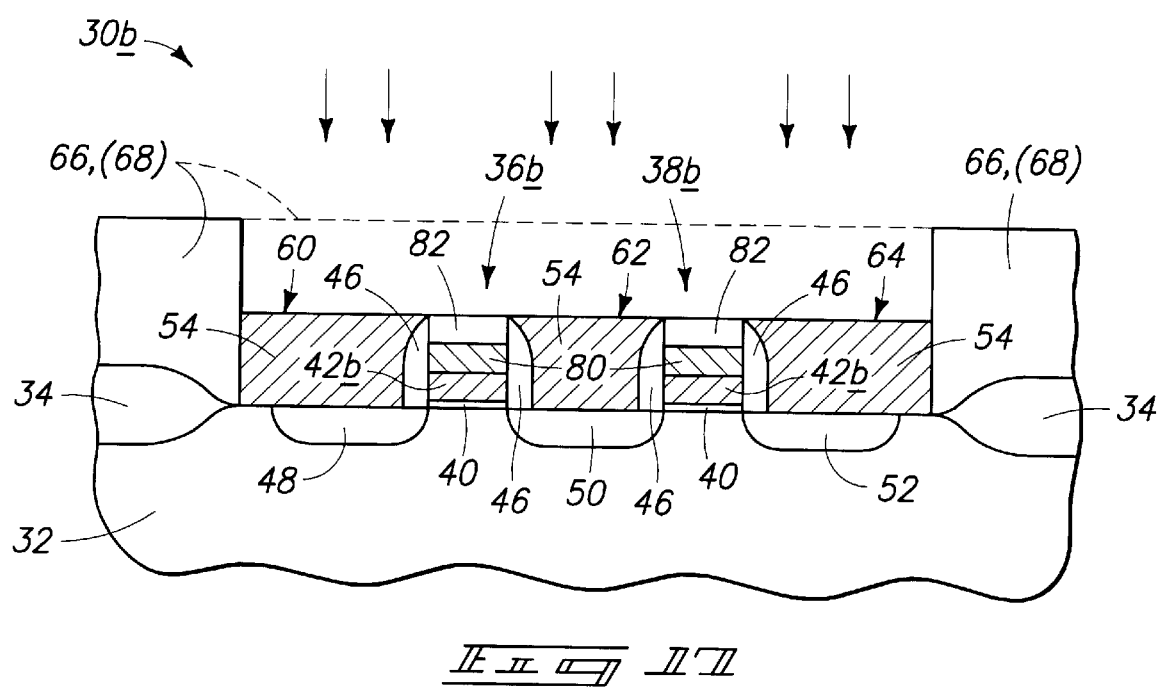
FIG. 17 is a view of the FIG. 13 wafer fragment at a processing step which is subsequent to that which is shown in FIG. 16.

Referring to FIG. 17, a patterned masking layer 66 is formed over substrate 32. In one embodiment, conductivity-modifying or conductivity-enhancing impurity is provided into the elevated source/drain material of regions 60, 62, and 64. Such impurity can be provided in the concentration mentioned above.

In one embodiment, material of the elevated source/drain regions 60–64 is doped in different steps. Such different steps can provide different impurity doses at different energy levels. In one embodiment, the semiconductive material is doped with a first dose of impurity which is provided at a first energy level, and then a second dose of impurity which is provided at a second energy level. The first dose is preferably substantially the same as the second dose, with an exemplary dose being $5 \times 10^{12}$ atoms/cm$^2$. Preferably, the second energy level is less than the first energy level, with an exemplary first energy level being 85 keV and an exemplary second energy level being 35 keV. Such will result in concentrations of implanted impurities which vary within the semiconductive material.

In another embodiment, a first region of elevated source/drain material is masked (with patterned masking layer 66 and not specifically shown) while a second region of elevated source/drain material (e.g. regions 60, 62, and 64) is doped with an impurity of a second type. In this example, masking layer 66 can be used to open up n-channel active areas to allow implantation of the undoped polysilicon thereover. Exemplary material for such doping include arsenic and/or phosphorous. In accordance with this embodiment, masking layer 66 is subsequently removed, and a second region of elevated source/drain material is masked, e.g. with masking layer 68, while a first region of elevated source/drain material (not specifically shown but disposed within masking layer openings which are substantially similar to the opening defined by previous masking layer 66) is provided with an impurity of a first type. In this example, masking layer 68 can be used to open up p-channel active areas to allow implantation of the undoped polysilicon thereover. Exemplary materials include boron and BF$_2$.

Subsequent processing, with respect to the formation of the elevated source/drain region silicide can take place as described in connection with FIGS. 7 and 8.

Figure 18:
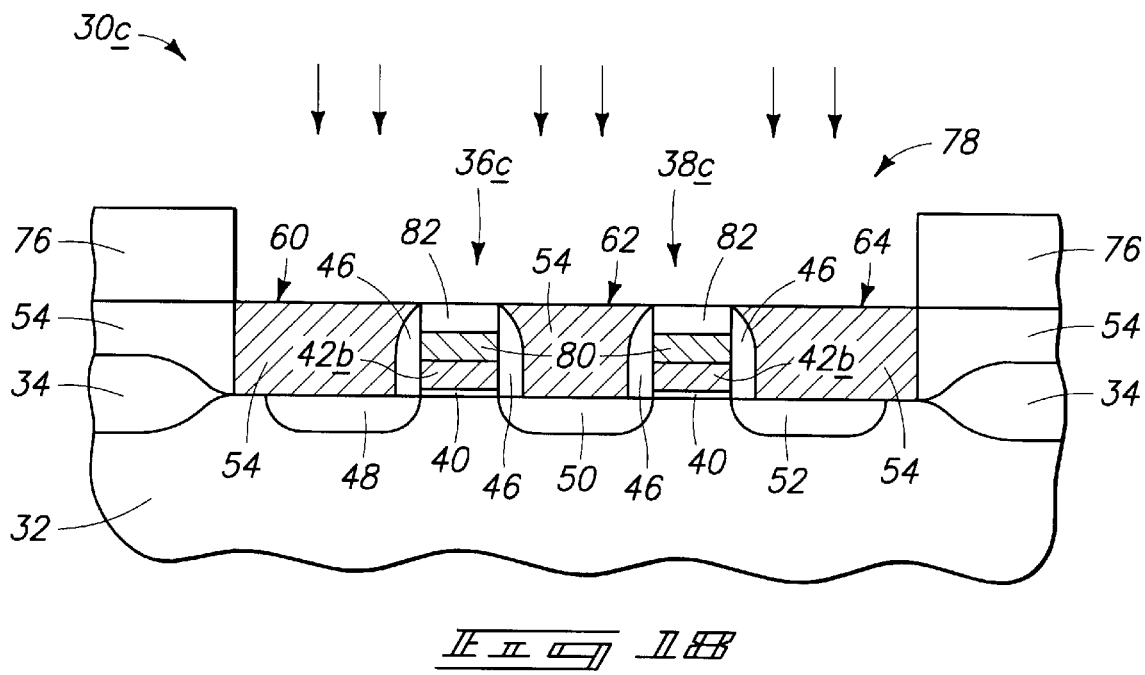
FIG. 18 is a diagrammatic side sectional view of a semiconductor wafer fragment in process in accordance with another embodiment of the present invention.

Referring to FIG. 18, a semiconductor wafer fragment in accordance with an alternate embodiment of the present invention is shown generally at 30c and includes a semiconductive substrate 32. Like numerals from the above-described embodiment have been utilized where appropriate, with differences being indicated by the suffix "c" or with different numerals.

A material layer 54 is formed over substrate 32 and processed as described above, which can include the planarization thereof. A patterned masking layer 76 is formed over the substrate including portions of undoped semiconductive material 54. Masking layer 76 defines a masking layer opening 78 which is disposed over only a portion of undoped semiconductive material of layer 54. Accordingly, material elevationally below masking layer 76 constitutes covered portions of layer 54, while exposed portions of layer 54 comprise elevated source/drain material regions for the field effect transistors.

Conductivity-modifying or conductivity-enhancing impurity is provided into exposed or unmasked portions of layer 54. Such impurity can be provided in the concentration mentioned above. Such materials can be doped as described above utilizing the first and second doses provided at the first and second energy levels, respectively. Accordingly, material of layer 54 disposed elevationally below masking layer 76 remains substantially undoped laterally outward of doped elevated source/drain regions 60, 62, and 64. After the provision of the impurity, the masking layer can be stripped.

Figure 19:
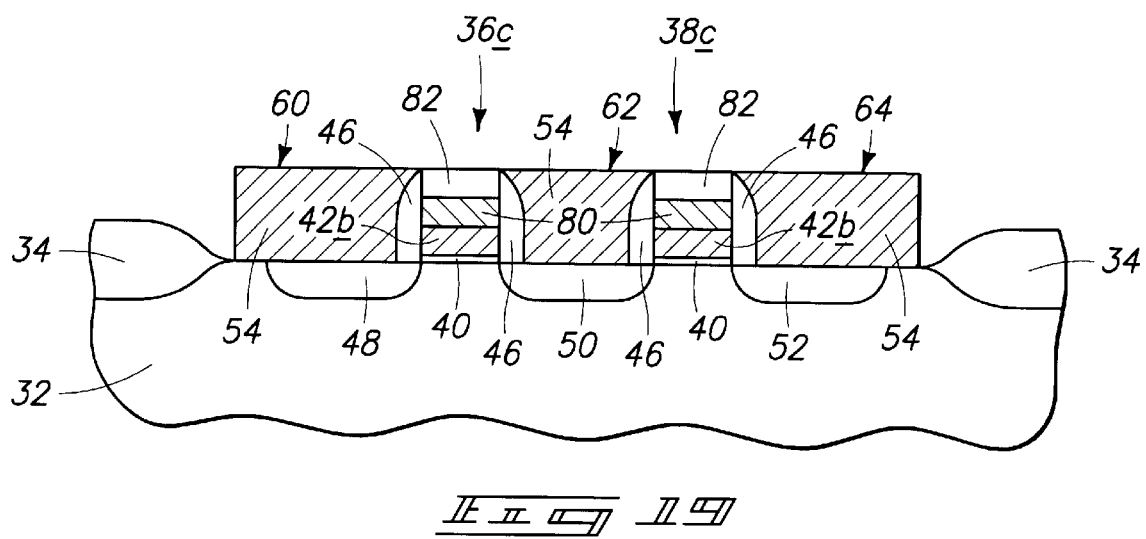
FIG. 19 is a view of the FIG. 18 wafer fragment at a processing step which is subsequent to that which is shown in FIG. 18.

Referring to FIG. 19, the undoped source/drain material portions are removed to provide elevated source/drain regions 60, 62, and 64. In a preferred embodiment, the removal of such material takes place through an etch which is effective to remove elevated source/drain material containing less impurity than elevated source/drain material containing more impurity. In the illustrated example, a wet etch is conducted which selectively removes undoped semiconductive material relative to the doped semiconductive material. An exemplary wet etch comprises two percent by volume tetramethyl ammonium hydroxide (TMAH) in water. Etch chemistries could, of course, be changed to achieve higher etch selectivity to doped versus undoped polysilicon. Accordingly, removal of the elevated source/drain material portions in this embodiment takes place after provision of the doping impurity and constitutes removing previously-masked portions of the semiconductive material layer to provide the elevated source/drain regions which comprise the previously-unmasked portions.

Subsequently, the substrate can be annealed such that both n+ and p+ plugs or source/drain regions is annealed at the same time.

Subsequent processing, with respect to the formation of the elevated source/drain region silicide can take place as described in connection with FIGS. 11 and 12.

Advantages of the present invention include improved CMOS formation techniques which use plugs or elevated source/drain regions over the p+/n+ active areas followed by a salicide process for sheet resistance reductions which improves robustness in the finished device. In addition, requirements of self-aligned contact etching in the previous DRAM processing flows can be reduced. Specifically, traditional formation of DRAM cells requires the use of a self-aligned contact etch through, for example, BPSG, to form DRAM cell capacitors. Various invented methods do not require such a self-aligned contact etch to form DRAM cell capacitors. The invented methods can also achieve n-channel and p-channel devices with elevated source/drain regions for better short channel characteristics without the use of additional masking steps. Moreover, realization of p+ polysilicon flows for p-type MOSFETs can be achieved without the use of any additional masks.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming integrated circuitry comprising:
   first forming a transistor gate line over a semiconductive substrate;

after the first forming, second forming a layer comprising undoped semiconductive material laterally proximate the transistor gate line, the undoped layer joining with semiconductive material of the substrate laterally proximate the gate line and comprising elevated source/drain material for a transistor of the gate line; and after forming the undoped layer, removing undoped semiconductive material portions to define elevated source/drain regions over the semiconductive substrate and providing conductivity-modifying impurity into the elevated source/drain material.

2. The method of claim 1 wherein the undoped layer is formed over source/drain diffusion regions comprised by the semiconductive substrate proximate the gate line.

3. The method of claim 1, wherein the conductivity-modifying impurity is provided to a concentration of at least $10^{20}$ cm$^{-3}$.

4. The method of claim 1 wherein the removing is prior to the providing of the conductivity-modifying impurity and comprises:
    forming a patterned masking layer over the undoped semiconductive material; and
    anisotropically etching unmasked portions of the undoped semiconductive material.

5. The method of claim 1 wherein the removing is after the providing of the conductivity-modifying impurity and comprises:
    forming a patterned masking layer over the undoped semiconductive material; and
    anisotropically etching unmasked portions of the undoped semiconductive material.

6. The method of claim 1 wherein after the providing of the conductivity-modifying impurity, the removing comprises conducting an etch which is effective to remove elevated source/drain material containing less conductivity-modifying impurity than elevated source/drain material containing more conductivity-modifying impurity.

7. The method of claim 6, wherein:
    the providing of the conductivity-modifying impurity comprises:
        forming a patterned masking layer over the undoped semiconductive material; and
        providing the conductivity-modifying impurity into unmasked portions of the undoped semiconductive material; and
    conducting an etch comprises selectively wet etching undoped semiconductive material of the elevated source/drain material relative to doped material of the elevated source/drain material to provide elevated source/drain regions.

8. The method of claim 1, wherein the forming of the transistor gate line comprises forming a layer comprising undoped semiconductive gate line material, and wherein the providing of the conductivity-modifying impurity comprises also providing conductivity-modifying impurity into the undoped semiconductive gate line material.

9. The method of claim 1, wherein:
    the forming of the transistor gate line comprises:
        forming a layer comprising undoped semiconductive gate line material; and
        forming an insulative cap over the undoped semiconductive gate line material; and further comprising prior to the providing of the conductivity-modifying impurity, removing the insulative cap, and wherein the providing of the conductivity-modifying impurity comprises contemporaneously providing conductivity-modifying impurity into exposed undoped semiconductive gate line material.

10. The method of claim 1 further comprising forming a common refractory metal layer over both exposed silicon-containing material of the transistor gate line and the elevated source/drain material, and exposing the substrate to conditions effective to render the refractory metal layer into a gate line silicide and a source/drain material silicide.

11. The method of claim 1 further comprising after the providing of the conductivity-modifying impurity, forming a refractory metal layer over silicon-containing material of the transistor gate line and exposing the refractory metal layer to conditions effective to render it into a conductive gate line silicide.

12. A method of forming integrated circuitry comprising:
    forming a transistor gate line of undoped semiconductive material over a semiconductive substrate;
    subsequent to forming the transistor gate line, forming a layer comprising semiconductive material laterally proximate the transistor gate line, the layer joining with semiconductive material of the substrate laterally proximate the gate line and the layer comprising elevated source/drain material for a transistor of the gate line;
    removing elevated source/drain material portions to define elevated source/drain regions over the semiconductive substrate; and
    in a common step, providing conductivity enhancing impurity into both the elevated source/drain material and the gate line.

13. The method of claim 12 wherein the layer is formed over source/drain diffusion regions comprised by the semiconductive substrate proximate the gate line.

14. The method of claim 12 wherein the conductivity enhancing impurity is provided to a concentration of at least $10^{20}$ cm$^{-3}$.

15. The method of claim 12 wherein:
    the forming of the transistor gate line comprises forming an insulative cap over the undoped semiconductive material; and
    the forming of the layer comprising semiconductive material comprises planarizing the semiconductive material layer relative to the insulative cap.

16. The method of claim 12, wherein the forming of the transistor gate line comprises forming an insulative cap over the undoped semiconductive material, and further comprising prior to the providing of the conductivity enhancing impurity, removing the insulative cap.

17. The method of claim 12 further comprising after the providing of the conductivity enhancing impurity, removing elevated source/drain material portions to provide elevated source/drain regions.

18. The method of claim 12 further comprising prior to the providing of the conductivity enhancing impurity, removing elevated source/drain material portions to provide elevated source/drain regions.

19. The method of claim 12 further comprising prior to the providing of the conductivity enhancing impurity, forming a patterned masking layer over the substrate, wherein the providing of the conductivity enhancing impurity comprises providing impurity into unmasked portions of the semiconductive material layer, and further comprising removing previously-masked portions of the semiconductive material layer to provide elevated source/drain regions comprising the previously unmasked portions.

20. The method of claim 19, wherein the removing of the previously-masked portions of the semiconductive material layer comprise conducting a wet etch sufficient to selectively remove semiconductive material layer portions containing less impurity relative to semiconductive material layer portions containing more impurity.

21. The method of claim 12 further comprising prior to the providing of the conductivity enhancing impurity:
forming a patterned masking layer over the semiconductive material layer; and
etching unmasked portions of the semiconductive material layer sufficient to provide elevated source/drain regions.

22. The method of claim 21, wherein the etching comprises conducting an anisotropic dry etch of the unmasked portions.

23. A method of forming integrated circuitry comprising:
forming a pair of spaced apart gate lines in a first forming, the gate lines comprising semiconductive material over a semiconductive substrate;
forming a layer comprising semiconductive material laterally proximate the gate lines in a second forming subsequent the first forming, the layer joining with semiconductive material of the substrate laterally proximate the gate lines and comprising elevated source/drain material for transistors of the gate lines;
removing portions of the layer comprising semiconductive material to define elevated source/drain regions over the semiconductive substrate;
commonly doping both the layer and the semiconductive material of the gate lines with a first dose of impurity provided at a first energy level; and
commonly doping both the layer and the semiconductive material of the gate lines with a second dose of impurity provided at a second energy level.

24. The method of claim 23, wherein the first dose is substantially the same as the second dose.

25. The method of claim 23, wherein the second energy level is less than the first energy level.

26. The method of claim 23, wherein the first dose is substantially the same as the second dose, and the second energy level is less than the first energy level.

27. The method of claim 23 wherein the forming of the transistor gate line comprises forming an insulative cap over the undoped semiconductive material and further comprising prior to the common dopings, removing portions of the insulative cap from over the gate lines thereby outwardly exposing the semiconductive material from which the gate lines are formed.

28. The method of claim 23, wherein the forming of the layer comprising semiconductive material comprises planarizing the semiconductive material layer to isolate the elevated source/drain material laterally proximate the gate lines.

29. The method of claim 23 wherein the removing portions of the layer is after the common dopings.

30. The method of claim 23, wherein the removing portions of the layer comprises forming a patterned masking layer over the layer comprising semiconductive material and doping unmasked portions of the semiconductive material layer, and further comprising after the common dopings, conducting a wet etch to selectively remove previously-masked semiconductor material layer portions relative to previously-unmasked semiconductor material layer portions and provide elevated source/drain regions comprising the previously masked semiconductor material layer portions.

31. The method of claim 23 wherein the removing portions of the layer is prior to the common dopings.

32. The method of claim 23 wherein the removing portions of the layer is prior to the common dopings and comprises:
forming a patterned masking layer over the layer comprising semiconductive material; and
anisotropically etching unmasked portions of the semiconductive material layer to provide elevated source/drain regions.

33. The method of claim 23 further comprising after the common dopings, forming a common refractory metal layer over gate line semiconductive material and elevated source/drain material and annealing the refractory metal sufficiently to render at least portions thereof into a gate line silicide and an elevated source/drain material silicide.

34. The method of claim 23 further comprising after the common dopings, forming a refractory metal layer over gate line semiconductive material and annealing the refractory metal sufficiently to render at least portions thereof into a gate line silicide.

35. A method of forming integrated circuitry comprising:
forming a transistor gate line over a substrate;
forming a layer comprising undoped semiconductive material laterally proximate the transistor gate line and over substrate areas corresponding to source/drain diffusion regions of the gate line, the semiconductive material layer joining with the substrate areas and comprising elevated source/drain material for the gate line;
forming a patterned masking layer over the substrate and defining a masking layer opening thereover, the masking layer opening being disposed over only a portion of the undoped semiconductive material layer, the gate line having a semiconductive outer surface that is exposed through the masking layer opening;
providing conductivity-modifying impurity through the masking layer opening and into both the elevated source/drain material and the exposed gate line outer surface; and
after the providing of the conductivity-modifying impurity, selectively removing portions of semiconductive layer material to form elevated source/drain regions over the substrate areas.

36. The method of claim 35, wherein the removing of the semiconductive layer material comprises selectively etching undoped semiconductive material relative to doped semiconductive material.

37. The method of claim 35, wherein the removing of the semiconductive layer material comprises selectively wet etching undoped semiconductive material relative to doped semiconductive material.

38. The method of claim 35 further comprising after the providing of the conductivity-modifying impurity, forming a gate line silicide layer over the gate line outer surface.

39. The method of claim 35 further comprising after the providing of the conductivity-modifying impurity, forming a common silicide layer over the gate line to comprise a gate line silicide layer, and over portions of the elevated source/drain material.

40. The method of claim 35 further comprising after the providing of the conductivity-modifying impurity, forming a common suicide layer over the gate line to comprise a gate line silicide layer, and over the elevated source/drain regions.

41. The method of claim 35 further comprising forming a common refractory metal layer over the gate line outer surface and the elevated source/drain regions, and annealing the refractory metal layer sufficiently to form a gate line silicide and an elevated source/drain region silicide.

42. A method of forming integrated circuitry comprising:
   forming semiconductive material over a substrate, wherein the forming of semiconductive material comprises:
      first forming semiconductive gate line material; and
      separately forming semiconductive elevated source/drain region material, the semiconductive material comprising material of a laterally proximate elevated source/drain region; and
      patterning the separately formed semiconductor material to define the laterally proximate elevated source/drain region over the substrate; and
   contemporaneously doping the semiconductive material of both the transistor gate line and the laterally proximate elevated source/drain region with a conductivity-modifying impurity.

43. The method of claim 42 wherein the semiconductive elevated source/drain region material is formed over source/drain diffusion regions comprised by the substrate proximate the gate line.

44. The method of claim 42, wherein the conductivity-modifying impurity is provided to a doping concentration of at least $10^{20}$ cm$^{-3}$.

45. The method of claim 42, wherein the forming of semiconductive material comprises:
   first forming semiconductive gate line material;
   second forming semiconductive elevated source/drain region material; and
   planarizing the semiconductive elevated source/drain region material.

46. The method of claim 42, wherein the forming of semiconductive material comprises:
   first forming semiconductive gate line material and an insulative material cap over the semiconductive gate line material; and
   second forming semiconductive elevated source/drain region material, and further comprising prior to the doping of the semiconductive material, removing the insulative material cap from over the semiconductive gate line material.

47. The method of claim 42 further comprising after the doping of the semiconductive material, forming a gate line silicide layer over the semiconductive gate line material.

48. The method of claim 42 further comprising forming a common refractory metal layer over semiconductive material of both the gate line and the elevated source/drain region, and exposing the substrate to conditions effective to render the refractory metal layer into a silicide layer comprising a gate line silicide and an elevated source/drain region silicide.

49. The method of claim 42 further comprising after the doping of the semiconductive material, forming a common refractory metal layer over semiconductive material of both the gate line and the elevated source/drain region, and exposing the substrate to conditions effective to render the refractory metal layer into a silicide layer comprising a gate line silicide and an elevated source/drain region silicide.

50. A method of forming integrated circuitry comprising:
   first forming a transistor gate line of semiconductive material over a semiconductive substrate;
   second forming semiconductive material over the substrate laterally proximate the transistor gate line and comprising elevated source/drain material, the second forming subsequent the first forming;
   patterning and etching the elevated source/drain material into source/drain regions over the semiconductive substrate;
   providing conductivity-enhancing impurity into semiconductive material proximate the gate line to form source/drain regions; and
   after the providing, forming a refractory metal silicide cap over and in electrical connection with the semiconductive material of the transistor gate line.

51. The method of claim 50 wherein the second formed semiconductive material is formed over source/drain diffusion regions comprised by the semiconductive substrate proximate the gate line.

52. The method of claim 50, wherein the conductivity-enhancing impurity is provided to a concentration of at least $10^{20}$ cm$^{-3}$.

53. The method of claim 50, wherein the providing of the conductivity-enhancing impurity comprises also providing the conductivity-enhancing impurity into semiconductive material of the gate line.

54. The method of claim 50 wherein the patterning and etching is prior to the providing of the conductivity-enhancing impurity;
   the patterning comprising forming a patterned masking layer over the elevated source/drain material to define masked and unmasked portions;
   the providing of the conductivity-enhancing impurity comprising doping the unmasked portions of the elevated source/drain material; and
   the etching comprising wet etching undoped portions of the elevated source/drain material relative to doped portions of the elevated source/drain material sufficient to form the source/drain regions.

55. The method of claim 50, wherein the forming of the refractory metal silicide cap also comprises forming a silicide layer over the elevated source/drain regions.

56. A method of forming integrated circuitry comprising:
   forming semiconductive material over a substrate, the semiconductive material comprising separately formed material of both a transistor gate line and a laterally proximate elevated source/drain region, wherein the separately formed material of the elevated source drain region is patterned and etched to define such region over the semiconductive substrate;
   forming a common refractory metal layer over semiconductive material of the transistor gate line and semiconductive material of the elevated source/drain region; and
   exposing the substrate to conditions effect to render the refractory metal into a silicide layer.

57. The method of claim 56 wherein the semiconductive material of the laterally proximate elevated source/drain region is formed over source/drain diffusion regions comprised by the substrate proximate the gate line.

58. The method of claim 56, wherein the forming of the semiconductive material comprises:
   first forming semiconductive gate line material; and
   second forming semiconductive elevated source/drain region material.

59. The method of claim 56 further comprising prior to the forming of the common refractory metal layer, doping the semiconductive material of the elevated source/drain region.

60. The method of claim 56 further comprising prior to the forming of the common refractory metal layer, contemporaneously doping semiconductive material of the elevated source/drain region and semiconductive material of the gate line.

61. A method of forming elevated source/drain regions of a field effect transistor comprising:

forming semiconductive material laterally proximate a previously formed transistor gate;

masking the semiconductive material to form covered portions and exposed portions, the exposed portions comprising elevated source/drain regions for the field effect transistor being formed;

doping the exposed portions with a conductivity-enhancing impurity;

stripping the masking after the doping; and selectively wet etching undoped portions of the semiconductive material relative to doped portions of the semiconductive material after the stripping, the selective etching defining the elevated source/drain regions laterally proximate the transistor gate.

62. The method of claim 61 wherein the semiconductive material is formed over source/drain diffusion regions comprised by a substrate proximate the transistor gate.

63. The method of claim 61, wherein the doping of the exposed portions comprises doping the portions to a doping concentration of at least $10^{20}$ cm$^{-3}$.

64. The method of claim 61 further comprising after the wet etching of the undoped portions of the semiconductive material, contemporaneously forming a silicide layer over the elevated source/drain regions and semiconductive material of the gate.

65. The method of claim 61 further comprising after the doping of the exposed portions, forming a gate silicide layer over semiconductive material of the gate.

66. A method of forming elevated source/drain regions of a field effect transistor comprising:

forming semiconductive material over a semiconductive substrate, portions of such material being laterally proximate a previously formed transistor gate, the semiconductive material comprising conductively doped elevated source/drain regions and undoped regions laterally outward thereof; and selectively wet etching undoped regions of the semiconductive material relative to doped regions of the semiconductive material over the semiconductive substrate.

67. The method of claim 66 further comprising after the wet etching of the undoped regions, forming a silicide layer atop the doped regions.

68. The method of claim 66 further comprising after the wet etching of the undoped regions, contemporaneously forming a silicide layer atop the both the doped regions and exposed semiconductive gate material.

69. A method of forming field effect transistors comprising:

forming a layer of semiconductive material overlying and laterally proximate a plurality of transistor gates previously formed over a substrate;

patterning and dry etching the semiconductive material to remove portions of the layer and to form elevated source/drain material laterally proximate the transistor gates;

masking a first region of the elevated source/drain material while doping a second region of elevated source/drain material with conductivity-enhancing impurity of a second type; and masking the second region of the elevated source/drain material while doping the first region of elevated source/drain material with conductivity-enhancing impurity of a first type.

70. The method of claim 69 wherein the semiconductive material layer is formed over source/drain diffusion regions comprised by the substrate proximate the transistor gates.

71. The method of claim 69, wherein the doping of the second region of elevated source/drain material also comprises doping semiconductive material of gates which are operably associated with the second region of elevated source/drain material.

72. The method of claim 69, wherein the doping of the first region of elevated source/drain material also comprises doping semiconductive material of gates which are operably associated with the first region of elevated source/drain material.

* * * * *

UNITED STATES PATENT AND TRADEMARK OFFICE
CERTIFICATE OF CORRECTION

PATENT NO. : 6,660,600 B2
DATED : December 9, 2003
INVENTOR(S) : Ahmad et al.

It is certified that error appears in the above-identified patent and that said Letters Patent is hereby corrected as shown below:

Column 3,
Line 6, after "thereon" insert -- ), --

Column 6,
Line 31, replace "above described" with -- above-described --

Signed and Sealed this

Twenty-first Day of December, 2004

JON W. DUDAS
*Director of the United States Patent and Trademark Office*